(12) United States Patent
Toschkoff et al.

(10) Patent No.: US 10,943,936 B2
(45) Date of Patent: Mar. 9, 2021

(54) METHOD OF PRODUCING AN OPTICAL SENSOR AT WAFER-LEVEL AND OPTICAL SENSOR

(71) Applicant: ams AG, Premstätten (AT)

(72) Inventors: Gregor Toschkoff, Graz (AT); Thomas Bodner, Seiersberg (AT); Franz Schrank, Graz (AT)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 16/316,724

(22) PCT Filed: Aug. 8, 2017

(86) PCT No.: PCT/EP2017/070094
§ 371 (c)(1),
(2) Date: Jan. 10, 2019

(87) PCT Pub. No.: WO2018/029204
PCT Pub. Date: Feb. 15, 2018

(65) Prior Publication Data
US 2019/0165020 A1    May 30, 2019

(30) Foreign Application Priority Data
Aug. 8, 2016  (EP) .................................... 16183205

(51) Int. Cl.
*H01L 27/146* (2006.01)
*H01L 31/0203* (2014.01)

(52) U.S. Cl.
CPC .. *H01L 27/14618* (2013.01); *H01L 27/14623* (2013.01); *H01L 27/14629* (2013.01);
(Continued)

(58) Field of Classification Search
CPC .......... H01L 27/14618; H01L 31/0203; H01L 27/14623; H01L 27/14629;
(Continued)

(56) References Cited

U.S. PATENT DOCUMENTS 9,305,967 B1    4/2016  Tharumalingam
2009/0243015 A1  10/2009  Yoneda et al.
(Continued)

FOREIGN PATENT DOCUMENTS

EP    3032583    6/2016
EP    3121853    1/2017
(Continued)

OTHER PUBLICATIONS

European Patent Office, International Search Report for PCT/EP2017/070094, dated Oct. 16, 2017.

*Primary Examiner* — Selim U Ahmed
(74) *Attorney, Agent, or Firm* — MH2 Technology Law Group LLP

(57) ABSTRACT

A method is proposed to produce an optical sensor at wafer-level, the methods comprises the following steps. A wafer is provided and has a main top surface and a main back surface. At or near the top surface of the wafer at least one integrated circuit is arranged having a light sensitive component. A first mold tool is placed over the at least one integrated circuit such that at least one channel remains between the first mold tool and the top surface to enter a first mold material. A first mold structure is formed by wafer-level molding the first mold material via the at least one channel. The first mold material creates at least one runner structure. A second mold tool is placed over the first mold structure and a second mold structure is formed by wafer-level molding a second mold material by means of the second mold tool. A light path blocking structure is arranged
(Continued)

on the top surface to block light from entering via the at least one runner structure.

11 Claims, 7 Drawing Sheets

(52) U.S. Cl.
CPC .. *H01L 27/14632* (2013.01); *H01L 27/14685* (2013.01); *H01L 27/14687* (2013.01); *H01L 31/0203* (2013.01); *H01L 27/14636* (2013.01)

(58) Field of Classification Search
CPC ......... H01L 27/14632; H01L 27/14685; H01L 27/14687; H01L 27/14636
See application file for complete search history.

(56) References Cited

U.S. PATENT DOCUMENTS

2013/0292705 A1    11/2013  Makimura et al.
2018/0226514 A1*   8/2018   Etschmaier ........... G01J 1/0271

FOREIGN PATENT DOCUMENTS

| JP | 2004-266844 | 9/2004 |
| JP | 2009-170469 | 7/2009 |
| WO | 2008/084646 | 7/2008 |

* cited by examiner

FIG 3
A)
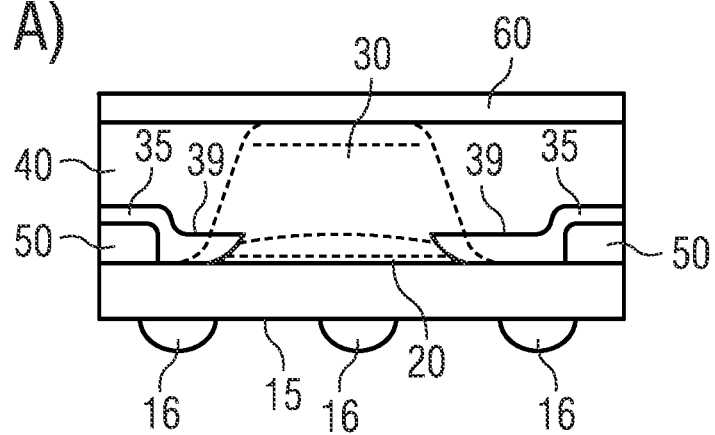
B)
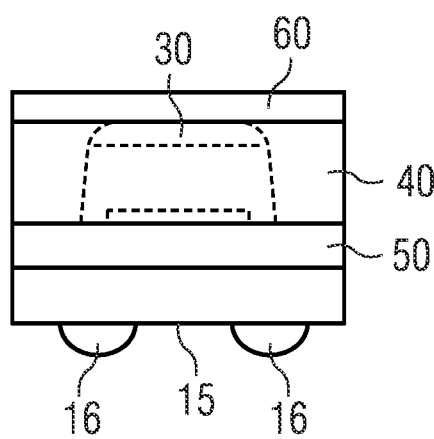
C)
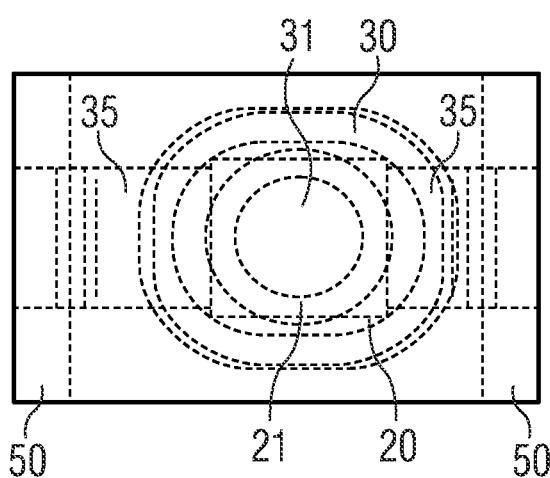

FIG 4
A)
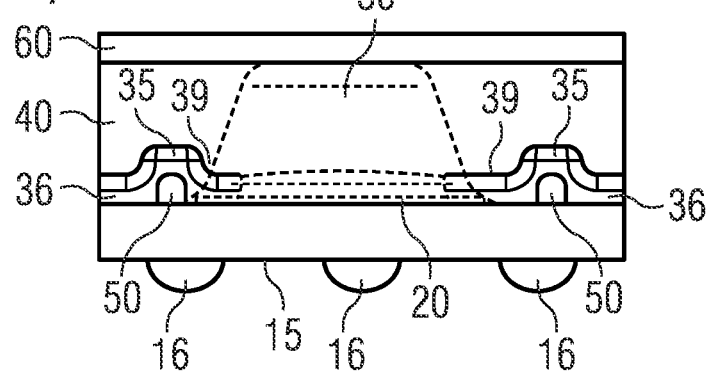
B)
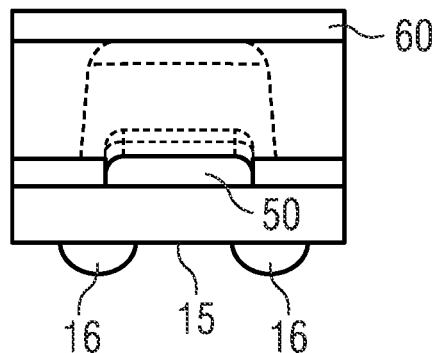
C)
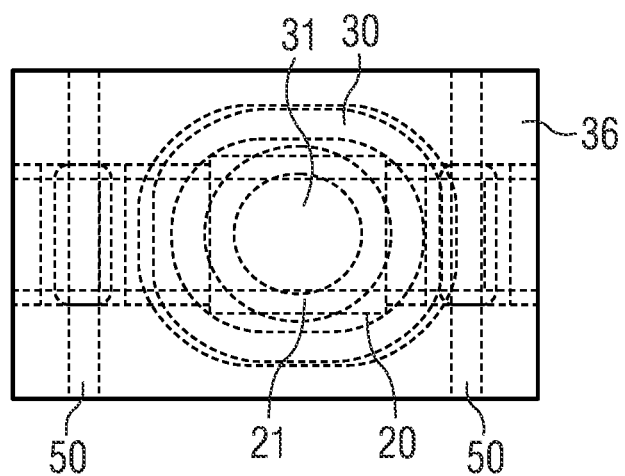

FIG 5
A)
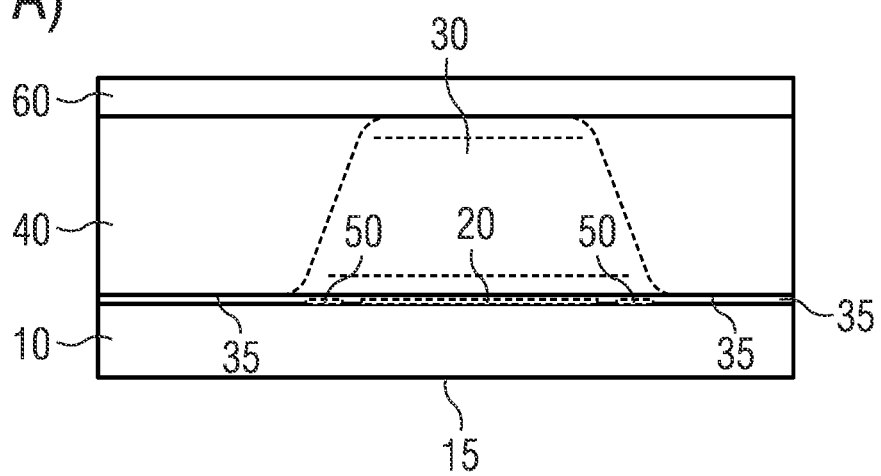
B)
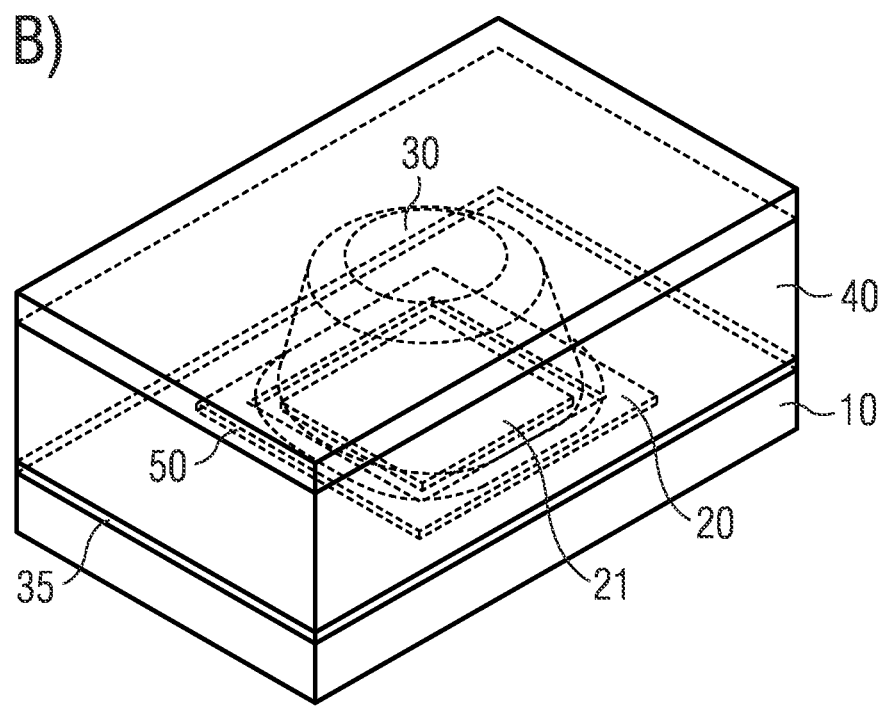

FIG 6
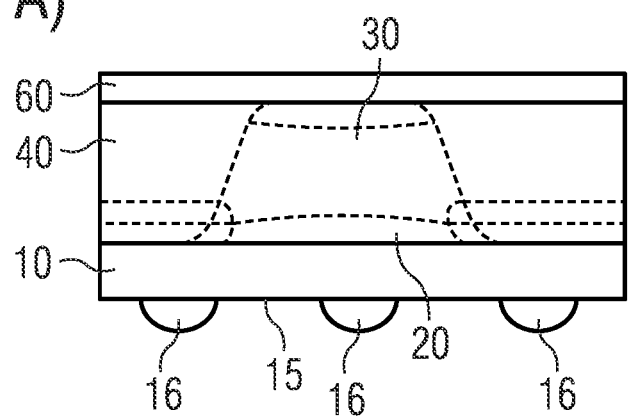
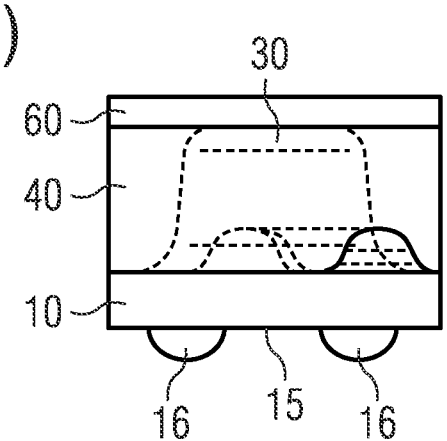
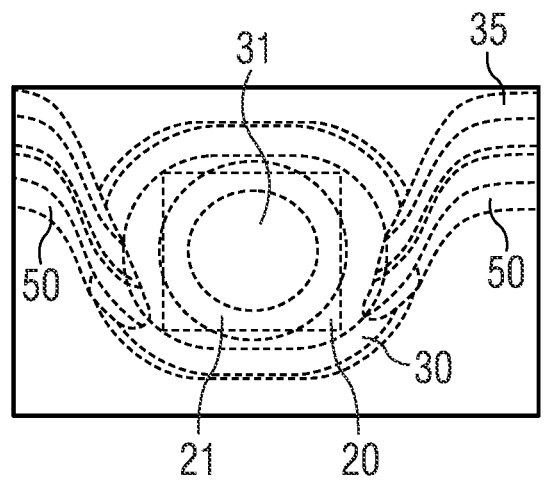

METHOD OF PRODUCING AN OPTICAL SENSOR AT WAFER-LEVEL AND OPTICAL SENSOR

This invention relates to a method of producing an optical sensor at wafer-level and to an optical sensor.

BACKGROUND OF THE INVENTION

Optical sensors find application in such diverse fields as detecting gestures, ambient light, and proximity of an object or for accurate color detection. Packaging technology of optical sensors, such as color sensors, often faces the conflicting requirement to have a small range of incident angles but yet a wide angular field of view to the outside world.

For many optical sensors, may be beneficial, or necessary in special cases, that light is incident from only a limited angle range. Especially in color sensors interference filters are implemented and often have shifts in their spectral response curves for light that impinges at off-axis angles. Existing packages use an aperture located at a certain working distance from the sensor and surrounding walls to block stray light. In addition, in order to increase the outside field of view, a diffuser is placed close to the aperture (above or below).

Typically, however, filter and diffuser need to be precisely adjusted and complex simulations need to be carried out in order to fit their optical properties and working distance, for example. Especially multilayer interference filters need to be arranged to account for the characteristic Lambertian distribution caused by the diffuser and, thus, needs to be specifically designed for a given sensor design. This leads to more complex and costly production. A challenge is to create a package in a time- and cost-efficient way for high volume manufacturing.

SUMMARY OF THE INVENTION

It is to be understood that any feature described in relation to any one embodiment may be used alone, or in combination with other features described herein, and may also be used in combination with one or more features of any other of the embodiments, or any combination of any other of the embodiments unless described as an alternative. Furthermore, equivalents and modifications not described below may also be employed without departing from the proposed method and optical sensor.

In at least one embodiment a method of producing an optical sensor at wafer-level comprises the following steps. First, a wafer is provided and has a main top surface and a main back surface. For example, the wafer comprises a semiconductor substrate such as silicon, silicon dioxide, aluminum oxide, sapphire, germanium, gallium arsenide (GaAs), an alloy of silicon and germanium, or indium phosphide (InP) or the like. The substrate may provide for additional electronic components such as terminals to interface the sensors, or further on-chip components such as a driver circuit, A/D converter, etc., i.e. generally means to operate and interface the optical sensor.

At least one integrated circuit is arranged at or near the top surface of the wafer. The integrated circuit has one or more light sensitive components. For example, the light sensitive component is arranged to convert electromagnetic radiation into a sensor signal such as a photocurrent. A target electromagnetic radiation may predominantly comprise light in the visible range between wavelengths from about 390 to 700 nm. In a broader sense "light" may also include parts of the infrared, visual and/or ultraviolet (UV). Examples of integrated circuits having one or more light sensitive components include photodiodes, CCDs or CMOS photo sensors. More than a single integrated circuit can be implemented in order to form an optical sensor array. The integrated circuits have in common that they can be manufactured, mounted and/or integrated into the optical sensor by means of a semiconductor process, such as CMOS, at wafer-level.

The first mold tool is placed over the at least one integrated circuit such that at least one channel remains between the first mold tool and the top surface. The at least one channel can be used to enter or apply a first mold material. For example, the first mold tool determines the shape and size of a mold structure and can be centered over the integrated circuit or other components of the wafer in order to selectively apply mold material at a given location on the wafer.

The first mold structure is formed by wafer-level molding the first mold material via the at least one channel. The first mold material creates at least one runner structure. For example, the mold tool allows for application of mold material via the channel. Typically, the mold is applied as a liquid under pressure, i.e. by means of wafer-level transfer molding. The runner structure, thus, can be considered a remainder of the molding process and, if not treated in some way, may form light pipes by which stray light can enter the first mold structure and, eventually, the light sensitive component.

A second mold tool is placed over the first mold structure. The second mold tool is used to form a second mold structure by wafer-level molding a second mold material. For example, the second mold structure encloses, or at least partly encloses, the first mold structure. Different materials can be used as first and second mold material. Correspondingly, also differently shaped mold tools can be used. For example, the second mold tool determines the shape and size of the second mold structure and can be centered over the first mold structure in order to selectively apply mold material. Thus, the second mold structure can be used to create a package of the optical sensor. Typically, the mold is applied as a liquid under pressure, i.e. by means of wafer-level transfer molding.

The light path blocking structure is arranged on the top surface of the wafer or into the first mold structure to block light from entering by the at least one runner structure. For example, the light path blocking structure determines the shape of the runner structure as it may form a barrier during the formation of the first mold structure. Consequently, mold material needs to run around the barrier that is the light path blocking structure. As a result the runner structure gets has a shape which is determined by the geometry (e.g. height, width, etc.) of the light path blocking structure. Any light entering such shaped runner structure needs the follow its shape in order to enter the first mold structure. Thus, by choosing a shape (determined by the light path blocking structure) which omits such light paths, impact of stray light can be reduced. Generally, light path blocking structure shape the runner structure in a certain way and/or function as blocker elements themselves.

In at least one embodiment the first mold material is at least partly optically transparent. This is due to using an optically transparent mold material as first mold material. Furthermore, the second mold material is at least partly optically opaque due to using an optically opaque mold material as second mold material. For example, different thermosetting polymers can be used as molding material.

For example, epoxy resins, silicones, polyamides or mixtures thereof can be used for both the first and second mold structure. These materials be optically transparent or opaque by addition of pigments, metal- or nano-particles, dyes or the like.

Optical transparency describes the physical property of light being able to pass through a material. The material used for molding the first molding structure may have a transmission within the visual spectrum between 400 nm and 800 nm or may even be extended into the near infrared up to 1000 nm and/or ultraviolet. Transparency should be high, for example higher than 50%. The actual choice of material, however, depends on the application and desired spectral range. Criteria include sensitivity of the light sensitive component and desired signal to noise ratio, for example. The term "opaque" indicates that a material is neither transparent, i.e. allowing all light to pass through, nor translucent, allowing some light to pass through. The term "opaque" in practice denotes that opacity of the molding material is high, at least higher than 50%, or close to 100% for the wavelengths mentioned above. Thus, the second material shields stray light away from the optical sensor.

In at least one embodiment of the light path blocking structure is arranged in the first mold structure by means of the first mold tool. Furthermore, the light path blocking structure is arranged by shaping the at least one runner structure to block light paths to the light sensitive component.

For example, the first mold tool comprises at least one shaped channel. As the first mold material is applied to the first mold tool by the channel or channels the runner structures essentially have the same shape as the channels. In a certain sense the light path of blocking structure is part of the runner structure or relates to the shape of the runner structure. The shape may comprise and the geometry that prevents for optical paths in the runner structure into the first mold structure. Thus, the runner structure may be curved, angulated or tilted. For example, the runner structure may be tilted several times.

In at least one embodiment at least one channel in the first mold tool is curved. Consequently, the at least one runner structure has a curved shape such that direct light paths to the light sensitive component via the runner structure are blocked.

In at least one embodiment the light path blocking structure is arranged on the top surface by applying a light blocking material. For example, the light blocking material can be considered a barrier which forces the flow of first mold material around the barrier. Geometry of the light path blocking structure (e.g. height and width etc.) can be chosen such that the runner structure is curved angulated or tilted.

By means of this resulting geometry light pass into the first mold structure are suppressed.

In at least one embodiment the light path blocking structure is arranged on the top surface before wafer-level molding the first mold structure. The first mold material is entered via the at least one channel and passed around the light path blocking structure.

In at least one embodiment the light path blocking structure is arranged by means of molding and opaque mold material on the top surface.

In at least one embodiment the light path blocking structure is arranged around and at least partly enclosing the light sensitive component. For example, the light path blocking structure comprises a frame which completely encircles the light sensitive component. At the same time the profile of the at least one channel can be broadened or thinned which further reduces exposure to stray light. The light blocking frame has a height which is sufficient to block incoming optical paths from reaching the light sensitive component.

In at least one embodiment the following steps are applied before or after wafer-level molding the first and/or second mold structures. The top surface and the back surface are electrically connected by means of at least one through substrate via. The redistribution layer comprising at least one metal layer is arranged on the back surface of the wafer. The at least one through substrate via is electrically connected with the redistribution layer. Finally, the redistribution layer is provided with an under bump metallization layer for attaching one or more bumps.

In at least one embodiment the first mold tool is structured and comprises at least one cavity. The cavity can be conical or tapered otherwise. For example, the cavity may have optical lens shape. The first mold material is applied into the at least one cavity while one or more channels. The second mold tool is flat or structured and has at least one opening to form at least one aperture over the light sensitive component.

In at least one embodiment the first mold tool comprises a plurality of cavities each of which are interconnected by channels. The first mold material is applied to the cavities through the interconnected channels.

More than just a single optical sensor can be produced at a time. To achieve this a plurality of integrated circuits are arranged or integrated on or into the wafer. The plurality of cavities in the first mold tool allowed to specifically and selectively apply the first mold structure over the respective integrated circuits. Followed by application of the light path blocking structure and the second mold structure several optical sensors are produced at a time. In a final step these components or units can be singulated or diced into individual optical sensors. This way the complete processing is performed at wafer-level.

In at least one embodiment one or more diffuser layers are applied onto the second mold structure. The diffuser layer broadens the field of view of the optical sensor and can also be applied at wafer-level, for example by a molding process.

In at least one embodiment an optical sensor comprises a semiconductor substrate, at least one integrated circuit, a first and second mold structure and the light path blocking structure.

The semiconductor substrate has a main top surface and a main back surface. The at least one integrated circuit is arranged or located at or near the top surface. The integrated circuit has a light sensitive component. The first mold structure comprises a first mold material and has at least one runner structure flanking the integrated circuit. The second mold structure comprises a second mold material. The second mold structure is arranged to enclose the first mold structure at least partly.

Finally, the light path blocking structure is arranged on the top surface and/or in the first mold structure. The light path blocking structure is designed to block light from entering via the at least one runner structure.

In at least one embodiment the first mold material is at least partly optically transparent. The second mold material is at least partly optically opaque.

In at least one embodiment the light path blocking structure comprises at least one runner structure to block light path to the light sensitive component. Alternatively, or in addition, the light path blocking structure comprises a light blocking material arranged on the top surface.

The proposed principle allows for packaging of optical sensors in a time- and cost-efficient way for high volume. At the same time the package has optical properties which previously often had to be applied on singulated units instead of a whole wafer. Mold may be applied selectively on optically exposed areas and an additional mold constitutes an enclosure surrounding the light sensitive components of the optical sensor to block light incident from the surface. Using multiple molding steps with different molds, e.g. transparent, opaque, and/or diffusive, reduces limitations and risks that are present when using opaque mold only on already singulated dies, and, thus, adds flexibility.

All steps are done on wafer-level, reducing cost compared to solutions where single die handling is needed. All parts consisting of different molds (e.g., clear shapes, opaque walls) can be integrated at wafer-level, minimizing the footprint and assembly costs. All feature dimensions and geometrical specifications (e.g. tapering angle of the shapes, radius of corners, wall thickness etc.) are such that they meet the manufacturing requirements for wafer-level transfer molding.

For example, the combination of a first mold that is produced by cavities in the first mold tool and a second opaque mold material does not need needle-like pin structures on the mold tool, such as the direct application of an opaque mold material would need to expose the light sensitive components of the optical sensor. Thus, the manufacturing is less prone to mechanical damage, reduces the pressure on the wafer and there is no risk of piercing a film. There is no risk of opaque mold flash on sensor surface during production.

The wafer-level package not only provides protection of the optical sensor but offers a more compact design. Smaller aperture openings are possible making the opening less visible to end users. Furthermore, a smaller device size is possible. A flat top surface without cavities provides easier handling of the optical sensor. Integrated addition of a diffuser or other layers on the package is possible in the same process at wafer-level. In conclusion, the package meets manufacturing requirements for mass-produced molded structures.

An aperture may be created at a defined distance from the substrate. The integration at the wafer-level is flexible as it allows for integration of further layers, such as a diffuser layer, in a single integration process. This way, small packages can be produced in an efficient manner. All parts consisting of different mold material can be integrated at wafer-level, minimizing footprint and assembly cost. In fact, using transfer molding on a wafer scale allows flexible choice of material, soft materials such as silicones or synthetic polymers reduce stress on the sensor components, for example.

In addition, stray light entering through the runner structures is effectively blocked by a runner shape such that little or no direct light path to the sensor are possible. This can be done by an appropriate runner shape alone, and/or by applying the light path blocking structure as a barrier onto the wafer. Both steps can also be combined which further improves light shielding. In fact, the light path blocking structure has the additional advantage that it mitigates a negative aspect from wafer-level molding in that no additional post-processing steps of runner treatment, such as runner sawing or etching, are necessary. This increases process robustness, increases process throughput, and reduces cost considerably.

In the following, the principle presented above is described in further detail with respect to drawings, in which exemplary embodiments are presented.

BRIEF DESCRIPTION OF THE DRAWINGS

FIG. 3 shows another exemplary embodiment of an optical sensor, FIG. 4 shows another exemplary embodiment of an optical sensor, FIG. 5 shows another exemplary embodiment of an optical sensor, FIG. 6 shows another exemplary embodiment of an optical sensor.

DETAILED DESCRIPTION

Figure 1:
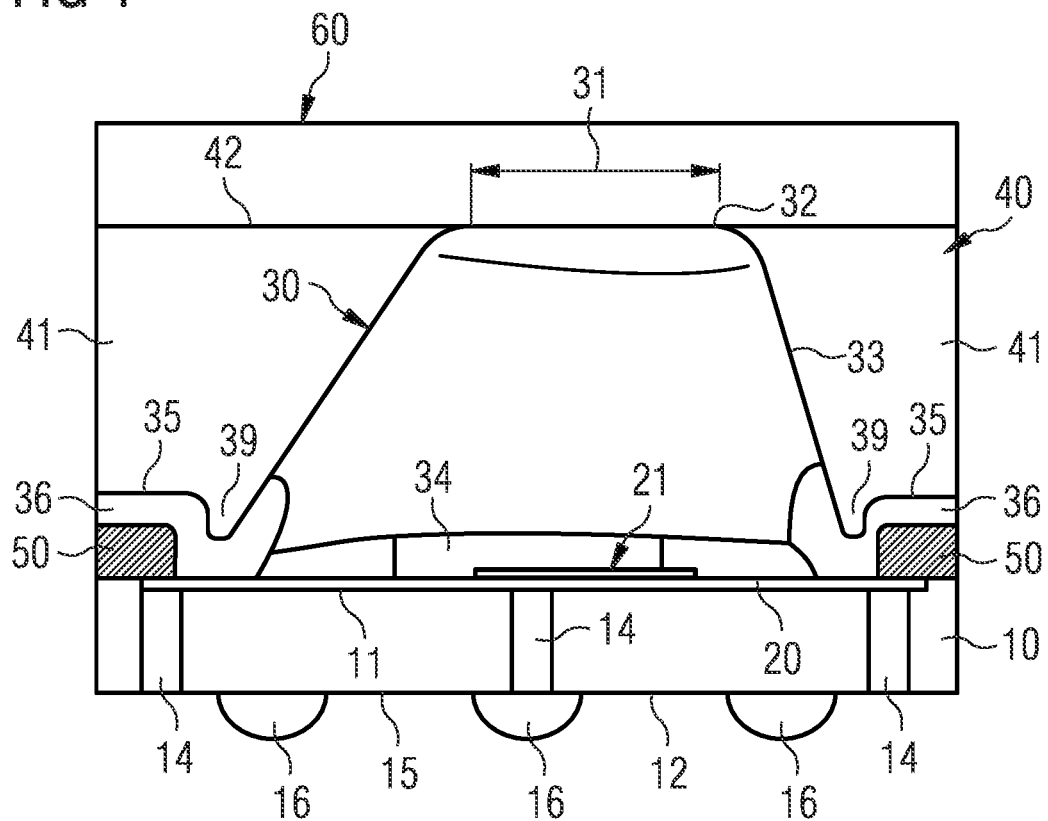
FIG. 1 shows an exemplary embodiment of an optical sensor.

FIG. 1 shows an exemplary embodiment of an optical sensor. The drawing depicts a cross-section of an optical sensor comprising a semiconductor substrate (as part of a wafer 10), an integrated circuit 20, a first mold structure 30, and a second mold structure 40.

The optical sensor has been manufactured at wafer-level together will a plurality of other sensors as will be discussed in greater detail below. In a final step, however, the wafer carrying a plurality of optical sensors has been singulated into final optical sensor package such as the one shown in FIG. 1.

The substrate (as part of wafer 10) comprises several through silicon vias 14 electrically connecting a front surface 11 and a back surface 12. A redistribution layer 15 and a number of solder balls (bumps) 16 are located on the back surface 12. The integrated circuit 20 is integrated into the substrate on the front surface 11 and comprises a light sensitive component 21. Furthermore, the integrated circuit 20 is electrically connected to the back surface 13 by means of the through silicon vias 14 and can be contacted by means of the solder balls 16. In this particular embodiment the integrated circuit 20 comprises a photodiode as light sensitive component 21.

The first mold structure 30 is arranged on the top surface 11 and over the integrated circuit 20 having the light sensitive component 21. The first mold structure 30 is aligned with respect to an aperture 31 and comprises a transparent mold material forming a tapered shape over the exposed areas, i.e. the light sensitive component 21. The first mold structure 30 has a top surface 32 of low curvature and is enclosed by the aperture 31 which is arranged in the second mold structure 40. Sidewalls 33 are tapered such that a profile of the first mold structure 30 broadens towards a bottom 34 which interfaces with the integrated circuit 20. Thus, the profile of the first mold structure 30 is larger at the bottom 34 than at the top 32. Runner structures 35 are located at two opposite sides of the optical sensor. These are remainders from the application of transparent first mold structure 30 and are arranged at sides 36 of the first mold structure 30.

In this embodiment the first mold structure 30 is not completely symmetric but the sidewalls 33 have different angles of inclination around the profile. This accounts for the actual placement of the light sensitive component 12 with respect to the substrate. In this particular embodiment, the light sensitive component 21 is somewhat shifted along a direction parallel to the top surface 12, but remains aligned with respect to a centerline through the aperture 31. In other embodiments, however, the light sensitive component 21 can be centered the profile of the first mold structure 30 can be symmetric around the centerline. Basically, the profile of the first mold structure 30 can be adjusted to fit the position of the light sensitive component 21.

In more detail, the first mold structure 30 is flanked by two runner structures 35. The runner structures 35 are a result of how the optical sensors are manufactured, by means of transfer molding, as will be discussed in greater detail below. Basically, a certain amount of first mold material is placed on the wafer (e.g. at sides 36) as a result of flowing mold during wafer-level molding through interconnecting channels 37 between cavities 38 arranged in a first mold tool 1. This structure will be denoted a "runner structure" hereinafter. The runner structures 35 interconnect respective first mold structures of optical sensors fabricated together on a wafer.

Furthermore, light path blocking structures 50 are arranged on the top surface 12 of the wafer 10. In fact, the light path blocking structures 50 are located at or near the runner structures 35, i.e. the structures resulting from the interconnecting channels 37 in the first mold tool 1. As typically more than just a single optical sensor are fabricated at a time, the wafer is diced into single units of optical sensors. The light path blocking structures 50 are thus located at edges 36 or boundaries of the optical sensors.

The light path blocking structures 50 are made from a light blocking material, such as an opaque mold, for example. The structures have a certain height and a width that, in this embodiment, at least corresponds to a width of the runner structure 35 which is located at the light path blocking structure 50, respectively. In this particular embodiment the width of the light path blocking structures 50 corresponds to a width of the optical sensor, e.g. a width of the substrate on which the first mold structure 30 is arranged on.

The light path blocking structures 50 constitute barriers in the sense that the runner structures 35 are bent around them. Thus, the runner structures 35 are shaped around the light path blocking structures 50. This has the effect that light entering the runner structures 35 cannot directly enter into the first mold structure 30 as respective optical paths are blocked due to the shape and geometry of the runner structures. Furthermore, the shape of the runner structures is bent so that even reflected light is blocked from reaching the light sensitive component 21. For example, the runner structures 35 in FIG. 1 have a groove 38 which blocks light effectively. This effect can be further supported by adding a light blocking coating onto the runner structures 35 such that reflection and/or refraction is reduced.

In this embodiment the first mold structure 40 is completely enclosed by the second mold structure 30 leaving open only an area confined by the aperture 31 on top of the first mold structure 30. The second mold structure 40 shields the optical sensor from optical stray light and effectively constitutes a wall 41 of a sensor package. A top surface 42 of the second mold structure 40 essentially is coplanar or flush with the aperture 31, i.e. top surface 21 of the first mold structure 30. Basically, this property is implemented by the specific manufacturing method described below but can be assisted with further planarizing or sawing. The second mold structure 40 can be provided with additional optical properties. For example, the top surface 21 near the aperture 31 can be given optical lens shape and may focus incident light towards the light sensitive component 21.

On top of the first and second mold structure 30, 40 a diffuser layer 60 is arranged and covers the whole optical sensor package. The diffuser layer 60 may be applied by means of wafer-level molding onto the top surface 42, thus, presenting an efficient way to integrate an adjustable diffusion, increasing a field of view of the optical sensor, into the package. Alternatively, the diffuser layer 60 may be added by other means, for example by adhering a pre-fabricated diffuser layer to the top surface 42.

Figure 2:
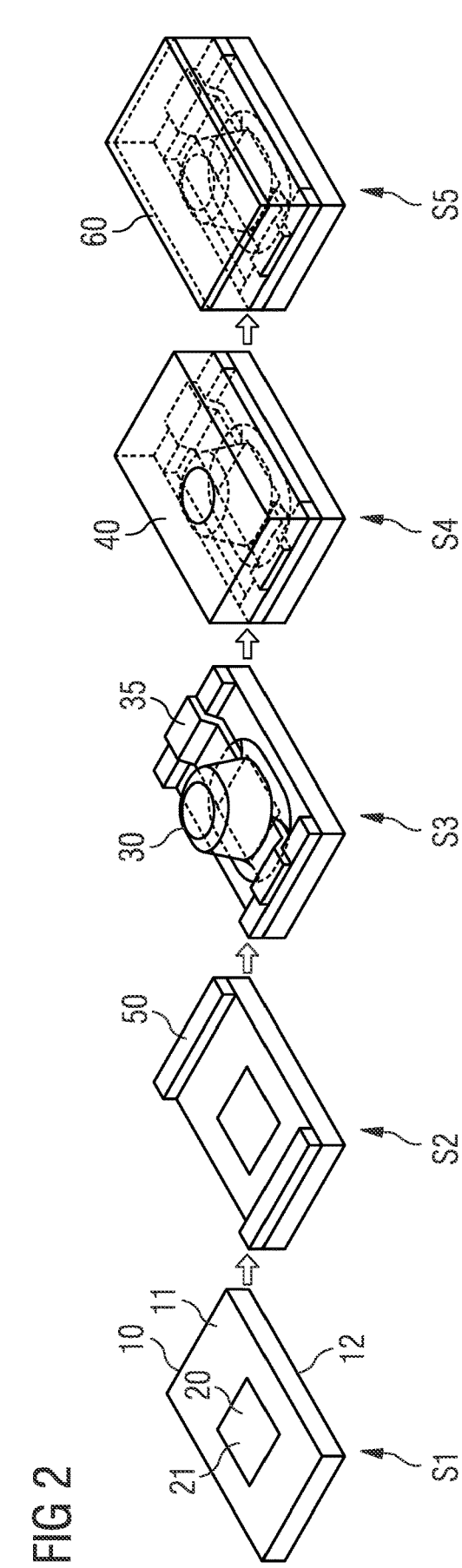
FIG. 2 shows an exemplary embodiment of a method of producing an optical sensor.

FIG. 2 shows an exemplary embodiment of a method of producing an optical sensor. The drawing shows a schematic process flow to illustrate the proposed method. Basically, the method can be summarized as five general steps 1 to 5, wherein the fifth step 5 is optional. All steps can be processed at wafer-level, i.e. each of the components of the optical sensor, e.g. integrated circuit 20, first mold structure 30, second mold structure 40, light path blocking structures 50, and diffuser layer 60, can be fabricated while still part of wafer 10, or attached to the wafer 10 during wafer-level processing. The term "wafer-level" indicates that processing steps are performed while the optical sensor is still part of the wafer 10, i.e. not singulated or diced into single dies or units. Thus, the proposed method can be considered a wafer-level chip scale packaging method.

A first step 1 relates to processing of the wafer front- and backsides, i.e. top surface 11 and back surface 12, by means of a semiconductor process such as CMOS processing, for example. The drawing shows wafer 10 having one (or more) integrated circuits 20 arranged on the top surface 11. The integrated circuits 20 each have at least one light sensitive component 21, such as a photodiode or infrared photodiode, for example. Typically, the wafer 10 comprises a plurality of integrated circuits 20 which are mounted, or integrated, side-by-side to each other. The drawing only shows a single die for reasons of easier explanation. Each integrated circuit 21 is mounted on or integrated into the top surface 11 of the wafer 10.

Electrical connections to the backside, or back surface 12, of the wafer 10 are established by through silicon vias 14 (not shown), for example by means of through silicon via (TSV) processing. Furthermore, a redistribution layer 15 is arranged at the back surface 12 of the wafer 10. The redistribution layer 15 can be a metal layer on the back surface 12 that makes the input/output pads or terminals of the integrated circuits available at other locations. For example, the redistribution layer 15 includes an under-bump metallization on the wafer back surface 12.

A second step 2 relates to application of the light path blocking structures 50 onto the top surface 11. Different embodiments of light path blocking structures 50 are possible and will be discussed in further details in FIGS. 3 to 6 below. Basically, one or more light path blocking structures 50 are implemented. Due to their presence and geometrical dimensions they determine and shape the runner structures 35 in a certain way and/or function as blocker elements themselves or block stray light.

A third step 3 relates to molding of the first, transparent mold structure 30. After the wafer 10 has been prepared according to the first and second steps 1, 2 above, and assembled with electronic components and circuitry, a wafer-level package is constructed. The package comprises at least the first and second mold structure 30, 40. The first mold structure 30 comprises a transparent mold material and will be denoted transparent mold structure hereinafter. The second mold structure 40 comprises an opaque mold material and will be denoted opaque mold structure hereinafter.

The transparent mold structure 30 is produced by application of a structured layer of transparent mold compound to the wafer 10. In fact, the transparent mold structure is selectively applied over optically exposed areas on the wafer top surface 11, i.e. the light sensitive components 21, for example. This third step 3 can be applied to the whole wafer front surface 11 by wafer-level molding, such that it forms symmetrical, conical or otherwise tapered shapes, which form the transparent mold structure 30.

The transparent mold structure 30 is manufactured by means of a first mold tool 1 which has a cavity or a plurality of cavities 38. The cavity or cavities 38 define the shape of the transparent mold structure 30. The first mold tool 1 establishes a system of interconnecting channels 37 through which mold material can enter into the cavities 38 by flowing between the channels 37. This way, a system of runner structures 35 comprising the transparent mold material is arranged on the wafer's front surface 10. The transparent mold structures 30 are, thus, connected with each other by means of the runner structures 35 (for details see Figures below).

For example, wafer-level molding involves transfer molding of liquid mold material over the whole wafer area, i.e. wafer-level molding is applied to the front surface 11 of the wafer 10 by means of the first mold tool 1. Any thermosetting material can be used as mold material, such as epoxy or polyamide resins or silicones, for example. Further particles such as pigments, metal particles or nano particles can be added in order to fine tune mechanical and optical properties of the transparent mold.

The light path blocking structures 50 determine the shape and geometry of the runner structures 35. For example, the light path blocking structures 50 in FIG. 2 are rod shaped and arranged on the top surface 11. As a consequence the mold material running though the interconnecting channels 37 in the first mold tool 1 needs to flow or pass around the light path blocking structures 50. The runner structures 35 created in this way are bent or curved. Furthermore, the light path blocking structures 50 also function as a barrier not only for mold material but to block stray light from entering into the transparent mold structure 30.

A fourth step 4 shown in FIG. 2 relates to application of the second mold structure 40. This opaque mold structure is applied on the wafer 10, e.g. to the whole wafer front surface 11 and over the transparent mold structure 30. For example, this can be realized by positioning a flat or structured second mold tool 2 over the transparent mold structure 30, and filling the resulting cavity between second mold tool and transparent mold structure 30 with opaque mold material. The opaque mold is applied to leave open an aperture 31 on the transparent mold structures 30. This way the light sensitive components 21 are still exposed to incident light.

Epoxy resins or silicones can be used as second mold material, for example. Further particles such as pigments, metal particles or nano particles can be added in order to fine tune mechanical and optical properties of the opaque mold. For example, the same mold material can be used for both the transparent and opaque mold structure 30, 40. By means of the additives, the same mold material can be made transparent or opaque. The terms "transparent" or "opaque" are defined with respect to a target light to be detected or emitted by means of the proposed optical sensors.

In other words, molds with different properties are applied at wafer-level to produce optically exposed areas on each optical sensor, effectively leading to walls 41 surrounding the light sensitive components 21 that block light from the side and providing an integrated process to efficiently produce small packages. The resulting optical sensor package, i.e. including the transparent and opaque mold structures 30, 40, has a defined total height, an exposed top and aperture 31 over the sensor, as well as opaque sidewalls 41 to block a large part of light incident from this side from reaching the light sensitive component 12.

An optional fifth step 5 shown in FIG. 2 relates to application of a diffuser layer 60. The diffuser layer 60 covers at least an area over the aperture 31. The diffuser layer 60 may cover the complete surface 32 of the opaque mold structure or only a smaller amount thereof as shown in this embodiment. The amount of this portion, for example, depends on the maximum or desired incident angle which should be collected by means of the optical sensor. The diffuser layer 60 is also manufactured by wafer-level molding, e.g. using a transparent mold material with light scattering particles.

The diffuser layer 60 funnels a certain portion of light incident from various incident angles into an area above the aperture 31, through the aperture 31 and towards the light sensitive components 21. This results in a wider angular field of view, while the incident angles on the optical sensor (fields of view seen by the sensor) still remains within certain boundaries.

FIG. 3 shows another exemplary embodiment of an optical sensor. The drawing shows an isometric view of an exemplary optical sensor from a first side (A), a second side (B), and from a top view (C).

Basically, the optical sensor shown in FIG. 3 corresponds to the one presented in FIG. 2, i.e. a light path blocking structure 50 is applied at an edge of the substrate, respectively, e.g. by wafer-level molding or other means. The runner structures 35 are created by mold material entered via respective channels 37 in the mold tool 1 above the light path blocking structure 50 and curve down towards the top surface 11 afterwards.

In this embodiment a light path blocking structure 50 is applied onto the sensor wafer top surface 11 before molding any of mold structures 30, 40 (see FIG. 2). In the subsequently applied transparent mold structure 30, the mold material needs to run around or bypass the light path blocking structure 50. The resulting runner structure 35 has a shape that that blocks most or all direct light paths from the outside of the package through the runner structure 35 to the light sensitive component 21 inside the transparent mold structure 30. The transparent mold structure 30 and light path blocking structure 50 are further surrounded by opaque mold from the opaque mold structure 40. The opaque mold structure 40, thus, forms the aperture 31 and desired package shape, and provides additional light blocking function. Additional layers such as diffuser layer 60 may be applied on the top.

FIG. 4 shows another exemplary embodiment of an optical sensor. The drawing shows an isometric view of an exemplary optical sensor from a first side (A), a second side (B), and from a top view (C).

This embodiment is based on the one presented in FIG. 3. The light path blocking structure 50 is applied onto the top surface 11 before molding any of mold structures 30, 40 (see FIG. 2), e.g. by wafer-level molding or other means. The runner structures 35 are created by mold material entered via respective channels 37 in the mold tool 1, i.e. a lower surface of the transparent runner structure 35 is on the top surface 11 of the substrate, but then curve up and down the light path blocking structure 50.

The runner structures 35 are the remainders of channels 37 used to fill the transparent mold structure 30 and are shaped in such a way that there is a reduced number of direct light paths from the outside of the package through the runner structures 35 into the transparent mold structure 30. The transparent mold structure 30 and light path blocking structures 50 are surrounded by opaque mold from the opaque mold structure 40. The opaque mold structure 40, thus, forms the aperture 31 and desired package shape, and provides additional light blocking function. Additional layers such as diffuser layer 60 may be applied on the top.

FIG. 5 shows another exemplary embodiment of an optical sensor. The drawing shows an isometric view of an exemplary optical sensor from a first side (A), and from a top view (C).

In this embodiment the light path blocking structure 50 is formed as an area runner, that is, the transparent structures are connected by a plane of relatively low height without areas free of transparent material on the top surface 11. Thus, there are no interconnecting channels but rather a broad channel is used in the first mold tool. The light path blocking structures 50 comprises a frame which encloses light sensitive area 21 to block light from all directions. Thus, the light path blocking structures 50 are formed to surround the light sensitive area 21 prior to application of the transparent mold structure 30. For the subsequent application of the transparent mold structure 30, the first mold tool 1 is arranged to create an "area runner", i.e., the complete top surface 21 is covered with a layer of transparent mold material, instead of dedicated runner structures with mold-free surface zones. The geometry of the area runner and light path blocking structure 50 is such that most or all direct light paths from outside to the sensor are blocked.

FIG. 6 shows another exemplary embodiment of an optical sensor. The drawing shows an isometric view of an exemplary optical sensor from a first side (A), a second side (B), and from a top view (C).

In this embodiment a light path blocking structure 50 is applied on the top surface 11 by means of a dedicated first mold tool 1, e.g. by wafer-level molding or other means. The first mold tool 1 comprises one or more curved channels 37 that interconnect cavities 38 arranged in the tool. Thus, the curved channels 37 allow mold material to form curved runner structure 35 when mold material is entered on the top surface 21. In other words, the light path blocking structure 50 is not a dedicated structure is applied previous to molding.

Rather the light path blocking structure 50 is a structural feature of the runner structures 35, i.e. a feature of the first mold structure 30. The runner structures 35 are located on the top surface 11, but are curved in this plane such that no direct light path from the side to the sensor chip is given.

Figure 7:
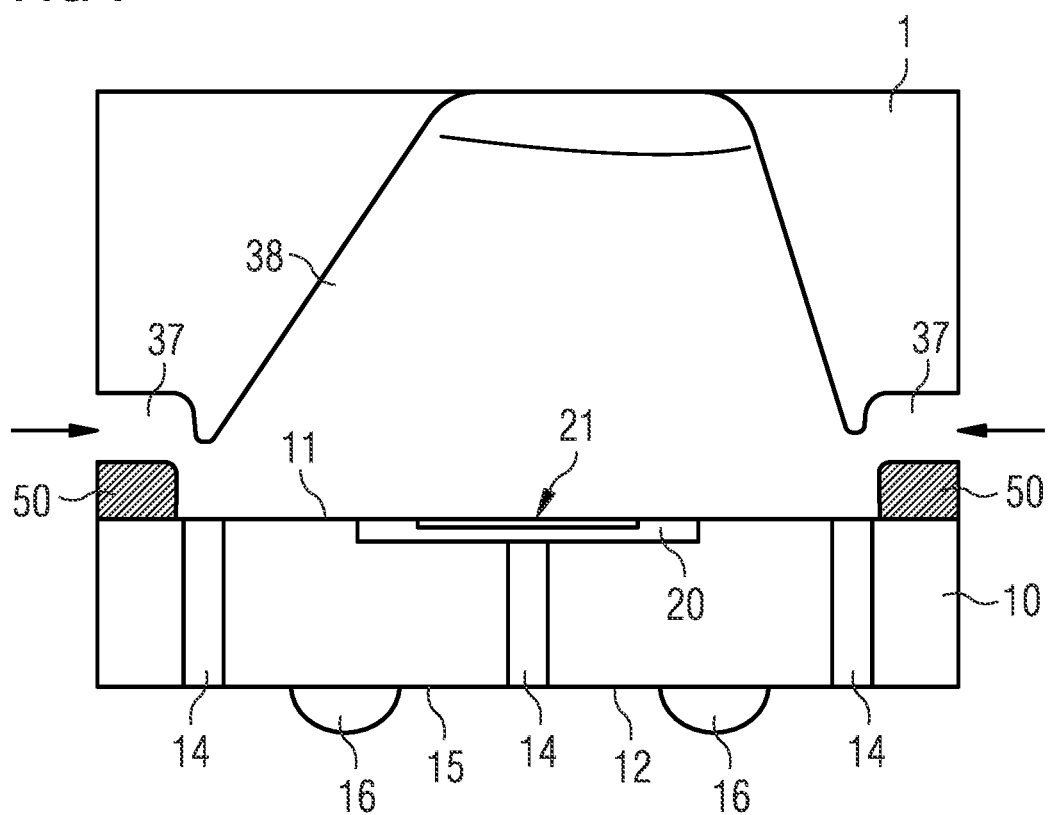
FIG. 7 shows an exemplary first mold tool.

FIG. 7 shows an exemplary first mold tool. The drawing depicts one part of the first mold tool 1 having a cavity 38. The mold tool is positioned over the light sensitive areas 21 of the integrated circuits 20 arranged on wafer 10. This way mold materials can be selectively applied over exposed areas. The cavity 38 has a conical or otherwise tapered profile which broadens from top to bottom. Sidewalls 38a of the cavity 38 are tapered such that the profile broadens towards bottom.

If placed over the integrated circuit 20 and centered on the light sensitive component 21, channels 37 open at two opposite sides of the tool 1. These allow for the transparent first mold material to enter the cavity 38 and fill out the profile. The first mold tool 1 is placed over the light path blocking structure 50 which has been arranged on the top surface 11 in a previous step. Consequently, the mold material is forced to flow or run around the light path blocking structure 50 and forms curved runner structures 35. The curvature is determined by the geometry of the light path blocking structure 50 and prevents light to enter the first mold structure 30 via the runner structures 35.

The invention claimed is:

1. A method of producing an optical sensor at wafer-level, comprising:
    providing a wafer having a main top surface and a main back surface,
    arranging at or near the top surface of the wafer at least one integrated circuit having a light sensitive component,
    placing a first mold tool over the at least one integrated circuit such that at least one channel remains between the first mold tool and the top surface to enter a first mold material,
    forming a first mold structure by wafer-level molding the first mold material via the at least one channel, wherein first mold material creates at least one runner structure,
    placing a second mold tool over the first mold structure and forming a second mold structure by wafer-level molding a second mold material by means of the second mold tool, and
    arranging a light path blocking structure on the top surface to block light from entering via the at least one runner structure, wherein:
        the light path blocking structure is arranged in the first mold structure by means of the first mold tool and by shaping the at least one runner structure to block light paths to the light sensitive component;
        the light path blocking structure is arranged on the top surface before wafer-level molding the first mold structure, and
        the first mold material entered via the at least one channel is passed around the light path blocking structure.

2. The method according to claim 1, wherein
    the first mold material is at least partly transparent due to using an optically transparent mold material as first mold material, and
    the second mold material is at least partly opaque due to using an optically opaque mold material as second mold material.

3. The method according to claim 1, wherein the at least one channelin the first mold tool is curved and the at least one runner structure has a curved shape such that direct light paths to the light sensitive component via the runner structure are blocked.

4. The method according to claim 1, wherein the light path blocking structure is arranged on the top surface by applying a light blocking material.

5. The method according to claim 1, wherein the light path blocking structure is arranged by means of molding an opaque mold material on the top surface.

6. The method according to claim 1, wherein the light path blocking structure is arranged around and at least partly enclosing the light sensitive component.

7. The method according to claim 1, wherein before or after wafer-level molding the first and/or second mold structures
    the top surface and the back surface is electrically is connected by means of at least one through-substrate via,
    a redistribution layer comprising at least on metal layer is arranged on the back surface of the wafer,
    the at least one through-substrate via is electrically connected with the redistribution layer, and
    the redistribution layer is provided with an under-bump metallization layer for attaching one or more bumps.

8. The method according to claim 1, wherein
the first mold tool is structured and comprises at least one cavity, and the first mold material is applied into the at least one cavity via one or more channels,
the second mold tool is flat or structured having at least one opening to form at least one aperture over the light sensitive component.

9. The method according to claim 1, wherein the first mold tool comprises a plurality of cavities each of which are interconnected by channels, and the first mold material is applied to the cavities through the interconnected channels.

10. The method according to claim 1, wherein one or more diffuser layers are applied onto the second mold structure.

11. The method according to claim 1, wherein
the first mold structure is formed by wafer-level transfer molding of liquid first mold material via the at least one channel,
the first mold material creates runner structures as a remainder of the molding process, and
the runner structures are located at two opposite sides of the integrated circuit.

* * * * *